US005757404A

United States Patent [19]

Witteveen et al.

[11] Patent Number: 5,757,404

[45] Date of Patent: May 26, 1998

[54] INKJET ARRAY AND METHOD OF PRODUCTION

[75] Inventors: Bontko Witteveen; Edwin Johan Buis, both of Venlo; Hubertus Gielen, Beringe; Ronald Berkhout, Venlo, all of Netherlands

[73] Assignee: OCÉ-Nederland, B.V., Venlo, Netherlands

[21] Appl. No.: 533,853

[22] Filed: Sep. 26, 1995

[30] Foreign Application Priority Data

Oct. 14, 1994 [NL] Netherlands ........................ 9401698

[51] Int. Cl.[6] ........................ H01L 41/22; B41J 2/01

[52] U.S. Cl. ........................ 347/71; 347/68; 29/890.1

[58] Field of Search ........................ 347/68–72; 29/25.35, 29/890.1

[56] References Cited

U.S. PATENT DOCUMENTS

| | | | |
|---|---|---|---|
| 5,266,965 | 11/1993 | Komai et al. . | |
| 5,270,740 | 12/1993 | Naruse et al. . | |
| 5,345,256 | 9/1994 | Stortz | 347/68 |
| 5,428,382 | 6/1995 | Shimosato et al. | 347/71 |
| 5,481,285 | 1/1996 | Pies et al. | 347/71 |
| 5,485,663 | 1/1996 | Ochiai et al. | 29/890.1 |

FOREIGN PATENT DOCUMENTS

| | | |
|---|---|---|
| 2101683 | 2/1994 | Canada . |
| 538843 | 4/1993 | European Pat. Off. . |
| 581395 | 2/1994 | European Pat. Off. . |
| 616891 | 9/1994 | European Pat. Off. . |
| 60-90770 | 7/1985 | Japan . |

*Primary Examiner*—Daniel P. Malley

*Attorney, Agent, or Firm*—Birch, Stewart, Kolasch & Birch, LLP

[57] ABSTRACT

An inkjet array provided with a piezoelectric member and a member in the form of a plate opposite the piezoelectric member, the plate member having a surface which faces the piezoelectric member provided with a number of parallel elongated ink ducts, while the piezoelectric member is provided with a number of elongated parallel piezoelectric elements substantially rectangular in cross-section, each piezoelectric element being situated opposite an ink duct, the piezoelectric member being received in a recess in a baseplate which abuts the ink duct surface of the plate member containing the ink ducts, and which is fixed to the plate member.

20 Claims, 5 Drawing Sheets

INKJET ARRAY AND METHOD OF PRODUCTION

BACKGROUND OF THE INVENTION

1. Field of the Invention

The present invention relates to an inkjet array provided with a piezoelectric member and a plate member opposite the piezoelectric member, the plate member having a surface which faces the piezoelectric member being provided with a number of parallel elongated ink ducts, while the piezoelectric member is provided with a number of elongated parallel piezoelectric elements substantially rectangular in cross-section, each piezoelectric element being situated opposite an ink duct.

2. Discussion of Related Art

Inkjet printheads are used in printers and the like, it being possible to discharge ink drops from intended ink ducts by controlling the current supply to the separate piezoelectric elements in order to cause expansion of the piezoelectric elements in the direction of the associated ink ducts and thus obtain ejection of an ink drop from an associated ink duct. However, inkjet printers of this nature suffer from stability.

SUMMARY OF THE INVENTION

Therefore, it is an object of the present invention to provide an inkjet printer which will overcome the prior art deficiencies.

A further object of the invention is to provide an inkjet array of simple construction while providing a solid support for its piezoelectric elements.

To this end, according to the present invention, the piezoelectric member is received in a recess in a baseplate which abuts the ink duct surface of a plate member containing the ink ducts and is fixed to the plate member. By using the construction according to the instant invention, the piezoelectric member is solidly enclosed in the recess of the baseplate, while the material selected for the baseplate can be independent of the material from which the piezoelectric member is constructed.

The present invention also relates to a method of making a piezoelectric member for an inkjet array which, in addition to the piezoelectric member, is provided with a plate member situated opposite the piezoelectric member, having on its surface facing the piezoelectric member a number of parallel elongate ink ducts. When assembling an inkjet array, it is important that the piezoelectric elements should be situated accurately opposite and parallel to the elongate ink ducts.

According to the invention, the piezoelectric member is fixed in a baseplate provided with at least one reference member used to fix the baseplate to the plate member provided with ink ducts during the assembly of the inkjet array, and then parallel incisions are formed in the piezoelectric member to form piezoelectric elements, the at least one reference member being used to locate the incisions. By using the same reference member in forming the incisions and assembling the inkjet array, it is possible to facilitate accurate adjustment of the piezoelectric elements with respect to the ink ducts. In this connection, in the method of making a plate member intended for an inkjet array, the surface of the plate member being provided with a reference member used in assembly of the plate member and a piezoelectric member in the inkjet array, during the formation of the ink ducts the reference member is used for locating the ink ducts to be formed.

BRIEF DESCRIPTION OF THE DRAWINGS

The invention will be explained in detail hereinafter with reference to various embodiments of an inkjet array according to the invention illustrated diagrammatically in the accompanying drawings wherein.

DETAILED DISCUSSION OF THE INVENTION

Figure 1:
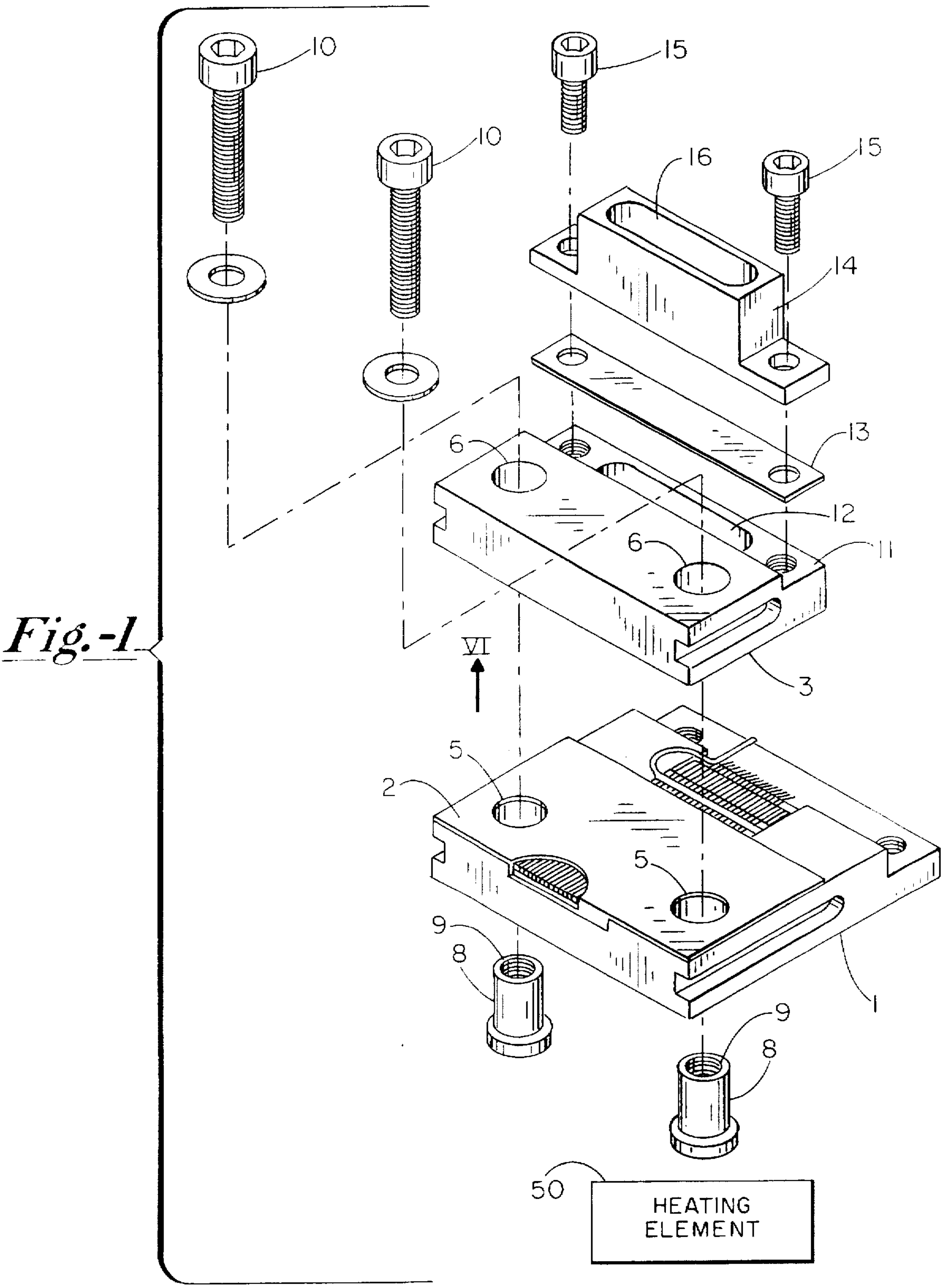
FIG. 1 is a perspective view of an inkjet array according to the invention, showing the various parts of the array in exploded form.
Figure 6:
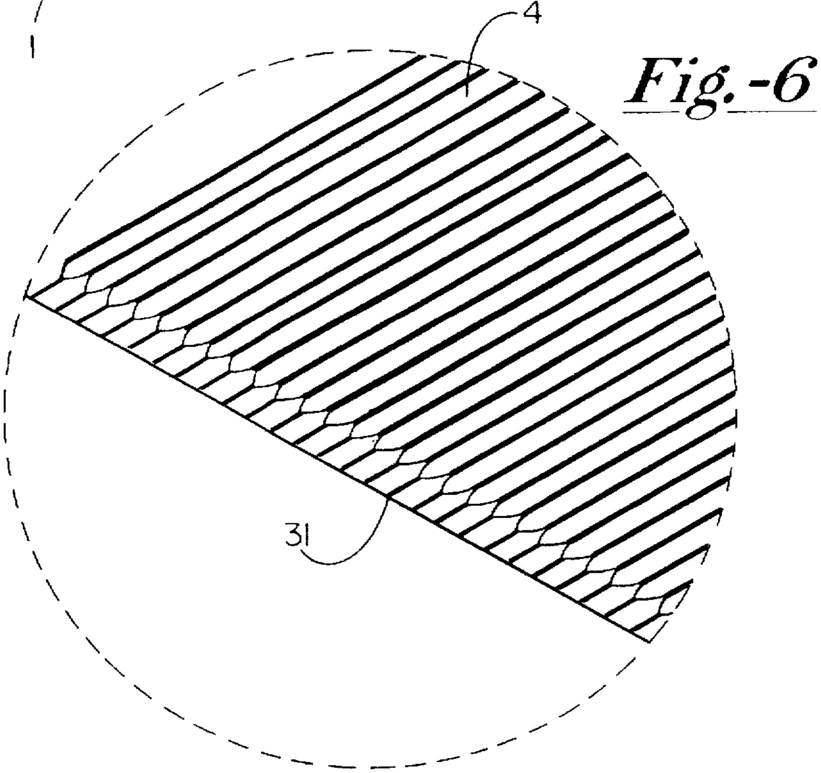
FIG. 6 is an enlarged scale bottom view of a plate member provided with the ink ducts, looking in the direction of arrow VI in FIG. 1.

As shown in FIG. 1, an inkjet printhead comprises a baseplate 1 for a piezoelectric member which will be described in detail hereinafter and which, with reference to FIG. 1, is covered at the top of the baseplate 1 by a plastic covering layer 2. The inkjet printhead also comprises a member 3 in the form of a plate having a surface which faces the baseplate 1. In the surface of the plate facing the baseplate, there is contained a large number of ink ducts 4 extending parallel to one another (FIG. 6). Accurately positioned holes 5 and 6 respectively disposed as an extension of one another are provided in the baseplate 1 and in the plate member 3. To assemble the inkjet array, the plate member 3 with its surface having the ink ducts 4 is placed on the plastic covering layer 2, while locating or inserting bushings 8 fit accurately in the holes 5 and 6 for accurate positioning of the baseplate 1 and the plate member 3 relatively to one another. The bushings 8 are provided with internally tapped bores 9 into which bolts 10 are screwed to fix the baseplate 1 and the plate member 3 to one another. Pressure-application springs or clamping springs can be used in wide inkjet arrays to produce the required clamping force. In this way, the printhead can always be repaired in the event of malfunction.

The plate member 3 is provided with a projecting part 11 formed with an elongate chamber 12 communicating with the ink ducts 4. With the interposition of a packing 13 a block 14 is fixed on the projecting part 11 by means of bolts 15. A chamber 16 is formed in the block 14 and at the bottom is in open communication with the recess 12 and during operation is used to supply ink to the inkjet array.

The construction of the piezoelectric member with the baseplate 1 supporting the same will now be explained in detail with reference to FIGS. 2–5 and FIG. 7.

Figure 2B:
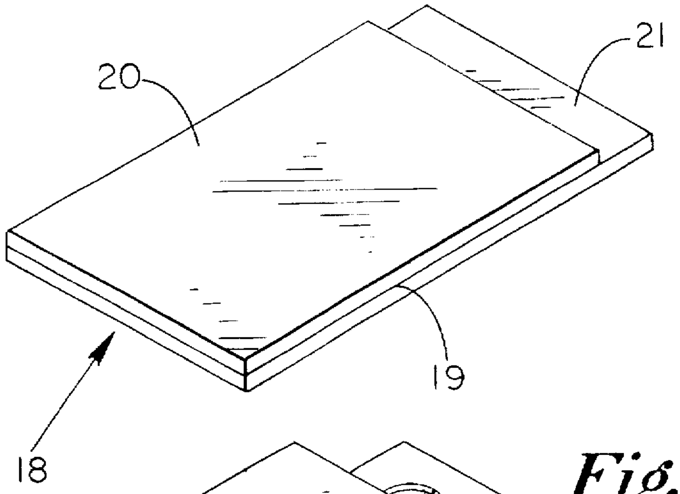
FIG. 2B is a perspective view of a piezoelectric member separated from the base plate of FIG. 2A.
Figure 2A:
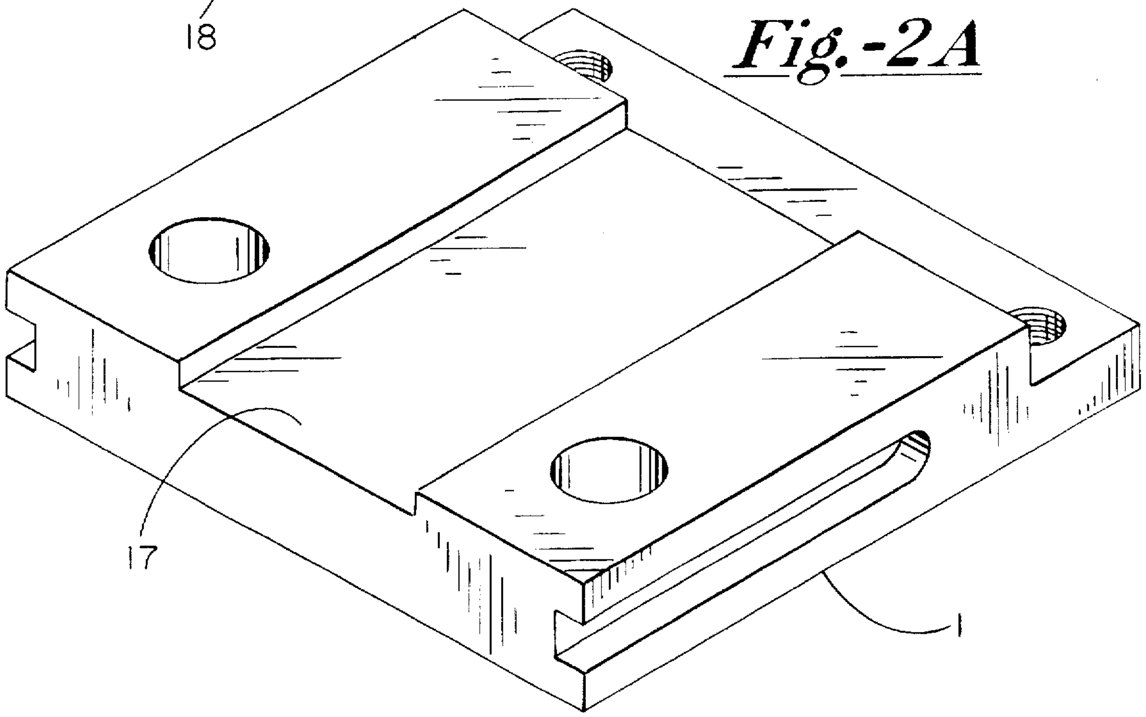
FIG. 2A is a perspective view of a baseplate.

As will be apparent from FIG. 2A, the top surface of the baseplate 1 is formed with a recess 17 which is rectangular in cross-section and open at both ends. This recess 17 is intended to receive flush therein a piezoelectric member 18 (FIG. 2B) which is constructed preferably from a ceramic support plate 19 and a plate 20 of piezoelectric material stuck to the top surface thereof. That surface of the plate 19 which faces the plate 20 is covered with a thin metal layer 21. As will be seen from FIG. 2B, the construction is such that the plate 19 projects from beneath the plate 20 at one end.

Figure 3:
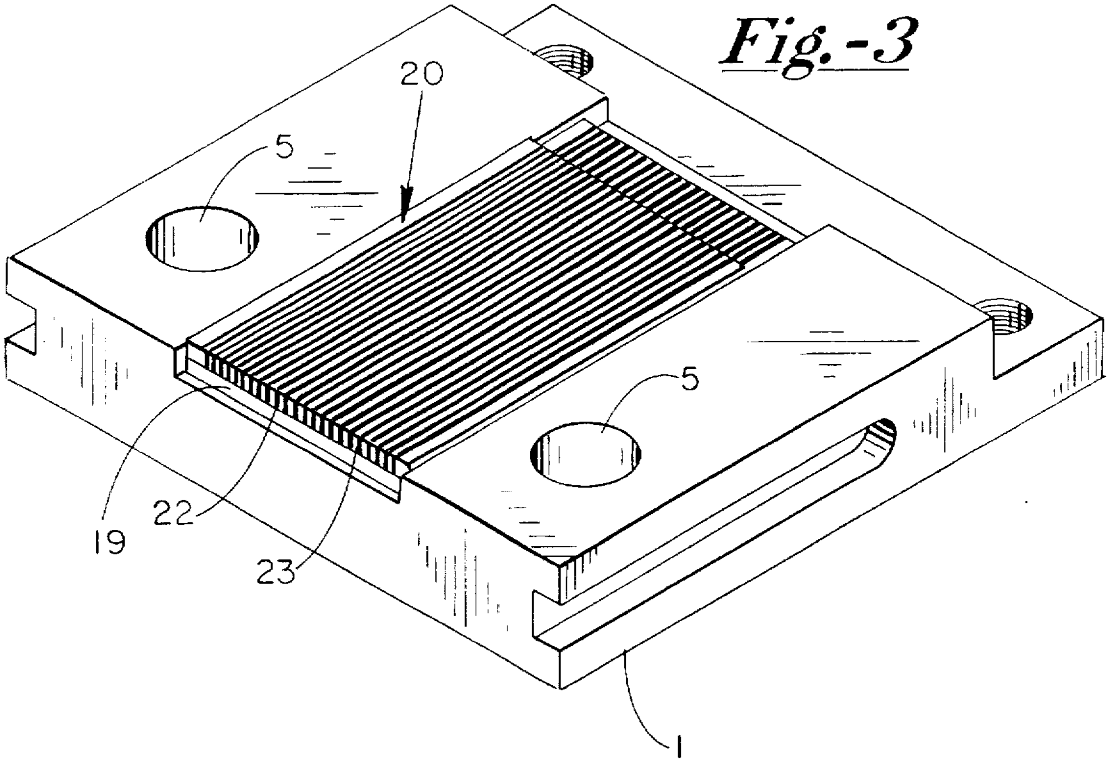
FIG. 3 shows the baseplate of FIG. 2A with the piezoelectric member secured therein, incisions having been formed in the piezoelectric member to form piezoelectric elements.

The piezoelectric element 18 of FIG. 2B constructed in this way is fixed in the recess 17 of the baseplate 1 of FIG. 2A, e.g. by gluing, in such manner that the coplanar ends of the plates 19 and 20 of FIG. 2B project inwards somewhat in the recess 17 of FIG. 2A with respect to the adjacent top surface of the plate 1 (FIG. 3). As will also be apparent from FIG. 3, the length of the ceramic plate 19 is a little shorter than the length of the recess 17, so that the plate 19 is supported by the bottom surface of plate 17 over its entire length.

After the piezoelectric element has been fixed in the recess, the baseplate 3 is fixed in a suitable processing machine for the formation of a number of slots extending parallel to one another in the longitudinal direction of the piezoelectric member, through the plate 20 and over a short distance in the plate 19, in such manner that the plate 20 is divided into a large number of piezoelectric elements 23 separated from one another by slots or incisions 22. When the incisions or slots 22 are made, at least one of the holes 5 in the baseplate 1 is used as a guide, such holes being accurately dimensioned and located, acting as a reference means for making the slots or gaps 22. As will be explained in detail hereinafter, this has a favorable effect on the assembly of the inkjet array, since holes 5 in fact also form reference means for locating the ink duct plate 3 relatively to the baseplate 1.

Figure 7:
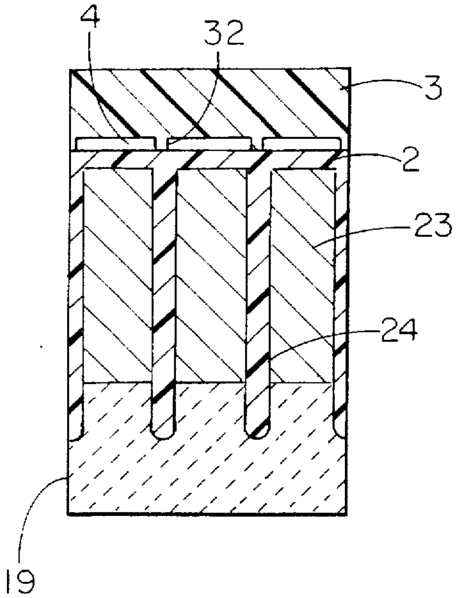
FIG. 7 is a cross-section of part of the piezoelectric member and ink ducts.

After the incisions 22 have been made, the plastic covering layer 2 is applied, for example by casting the plastic such that it also penetrates into the incisions 22 in the plates 19 and 20 so that these incisions are filled with plastic separating strips 24 which separate the piezoelectric elements 23 from one another (FIG. 7).

As will be explained in detail hereinafter, it has been found advantageous to prevent the separating strips 24 from adhering to the piezoelectric elements 23. To this end, before the plastic forming the covering layer 2 and the separating strips 24 is poured, the facing sides of the piezoelectric elements 23 can be treated with a substance which prevents subsequent adhesion of the plastic material forming the separating strips 24 to the opposite wall parts of the piezoelectric elements 23. To this end, for example, a layer of material covering the free top edges of the piezoelectric elements 23 can first be placed over the piezoelectric member, whereafter a suitable liquid which, for example, leaves a thin Teflon layer on the facing sides of the piezoelectric elements 23, is passed through the gaps between the piezoelectric elements 23.

Figure 4:
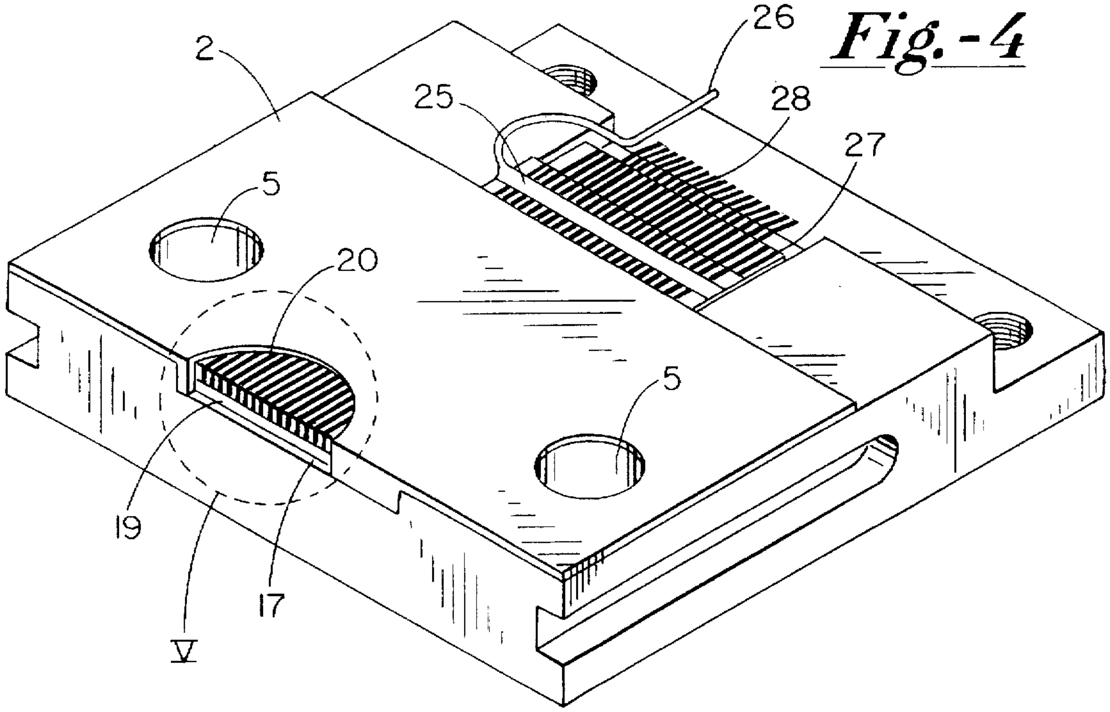
FIG. 4 is a similar view to FIG. 3 with the piezoelectric member covered by a plastic layer and connections provided for the supply of current to the piezoelectric elements.
Figure 5:
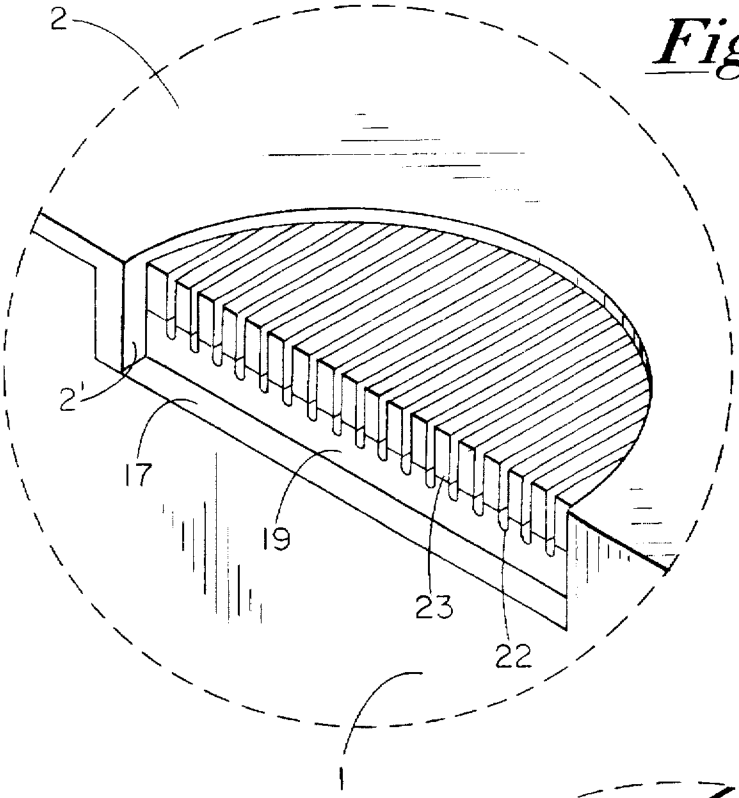
FIG. 5 is an enlarged scale view of the detail V encircled in FIG. 4.

As will also be clear from FIGS. 4 and 5, the space formed near one end face of the baseplate 1 at that end of the piezoelectric member which recedes slightly with respect to the associated end face, is also filled with a plastic layer 2', it also being possible to ensure that this plastic projects initially slightly beyond the associated end face of the baseplate 1. The top surface of the covering layer 2 is also finished to be very accurately flat.

As will also be apparent from FIG. 4, the piezoelectric elements project slightly beyond the covering plate 2. Those ends of the piezoelectric elements 23 which project from the covering plate 2 are interconnected by a conductor 25, which can be earthed by means of a cable 26 when the device is in use.

It will also be clear that the provision of the incisions 22 causes the plate 19 to be subdivided, at the metal layer 21 forming its top, into a large number of electrodes 27 each connected to one of the piezoelectric elements 23. A lead 28 for the supply of current is connected to each of these electrodes.

A number of parallel ink ducts 4 (FIGS. 6 to 9) are formed in that surface of the plate member 3 which faces the baseplate, i.e., in the bottom of the plate 3 in the position shown in FIG. 1. These ink ducts have a constant depth (±10 to 100 μm deep, preferably 30 μm deep) over their entire length, and a constant rectangular cross-section over the major part of their length. Comparable results were also obtained with shallow ducts which were of decreasing depth towards one side. By means of these shallow ducts it is possible to increase the integration density (number of ducts per mm) without appreciably affecting the strength and life of the array.

To assemble the array, that surface of the plate 3 which is formed with the ink ducts is placed on the covering layer 2 so that the latter bears against ribs 32 which separate the ink ducts from one another and form part of the plate 3, so that a good seal is obtained between adjacent ink ducts 30. During this assembly, a piezoelectric element 23 extending parallel to the ink duct will be located opposite each ink duct 4 in the manner indicated in FIGS. 7 to 9. This accurate alignment of the piezoelectric elements 23 (with a width of about 150 μm) with respect to the ink ducts 30 (with a width of about 200 μm) is achieved in a simple and efficient manner that the holes 5 and 6 in the plates 1 and 3 respectively, which ensure accurate positioning of the plates relatively to one another by means of locating bushings 8, which are used as reference means for locating the incisions 22 and ink ducts 4 respectively.

After the two plates 1 and 3 have thus been fitted against one another by means of the bolts 10, the end surface of the resulting assembly where the jets 31 discharge can be finished, with any excess of plastic being removed from the covering edge 21 of the piezoelectric member received in the recess 17.

Figure 8:
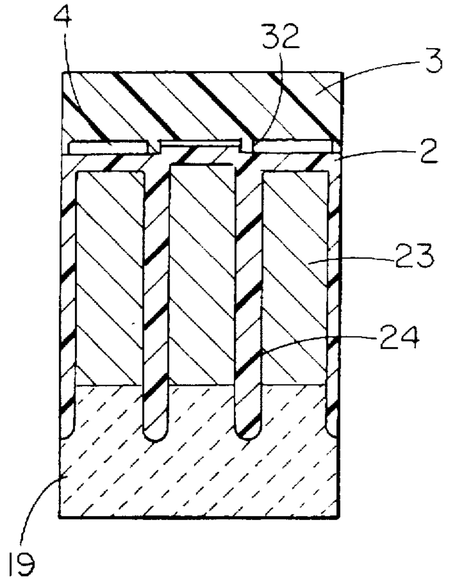
FIG. 8 is a similar cross-section to FIG. 7 showing one of the piezoelectric elements activated.
Figure 9:
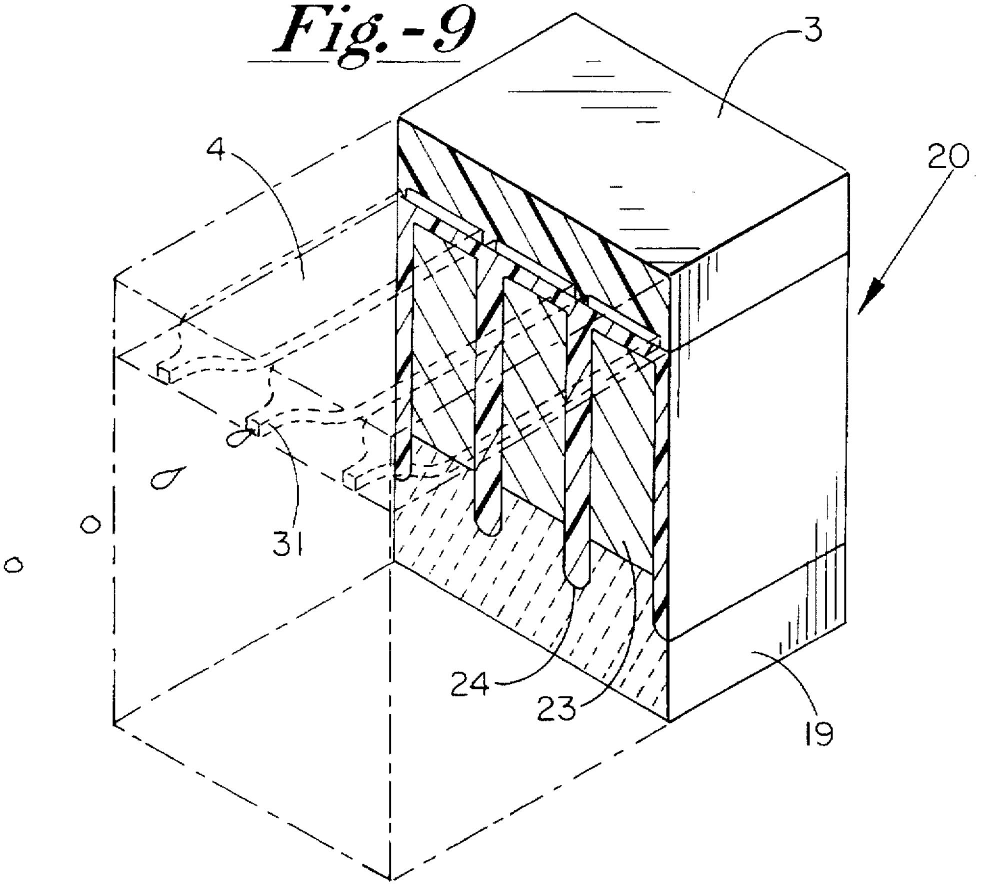
FIG. 9 is a perspective view of part of the piezoelectric member intended to show the construction of the ink ducts.

As shown diagrammatically in FIG. 8, when a piezoelectric element is triggered by the supply of a control current via a cable 25, the associated piezoelectric element will expand so that part of the covering layer 2 extending over that piezoelectric element is forced up into the associated ink duct 4 so that ink is ejected in the form of a drop via the jet 31 of the associated ink duct, as shown diagrammatically in FIG. 9. Since, as already explained above, care is taken to ensure that the piezoelectric elements 23 are prevented from adhering to one another by separating strips 24, such intended displacement of that part of the covering layer 2 which covers the piezoelectric element can take place with much less energy than in the case in which the separating strips 24 are fixed to the piezoelectric elements 23. Control of the volume of an ink duct situated adjacent the ink duct opposite the piezoelectric element activated to eject an ink drop also appears to be considerably less than in the case of a rigid connection between the piezoelectric elements 23 and the separating strips 24 which separate the piezoelectric elements from one another.

The above-described inkjet array is intended more particularly for use with ink which is solid at room temperature (hot-melt ink-jet system). To keep the ink liquid during operation, a heating element 50 can be disposed, for example, beneath the baseplate 1. Since the plate 20 (FIG. 1) is divided into a number of completely separated piezoelectric elements 23 (FIG. 7) disposed on the ceramic support layer 19, the coefficient of expansion of the piezoelectric material on heating of the inkjet array will not cause the piezoelectric elements 23 to be displaced with respect to the plate 3 and hence arrive next to the ink ducts 4. This is the case particularly if the plate 3 is also made of ceramic material. A good effect at elevated temperature is also obtained with a plate 3 made from a metal or plastic having a coefficient of expansion which does not differ too much from that of the support plate 19. Since in such hot-melt ink-jet systems the melting temperature of the ink is generally between 60° C. and 120° C., the plastic used for the separating strips 24 is also one which is resistant to such temperature.

The same applies for all other plastics used in the inkjet array for use in hotmelt inkjet systems. These must be thermally stable, resistant against the inks used, swell as little as possible and have a viscosity low enough to be used for casting purposes. It was shown that fluor containing rubbers, with a fluor content as high as possible, fulfills these requirements. Very good inkjet arrays were achieved by using a liquid fluor silicon rubber unfilled and cured via a hydrosilylation reaction with a cross linking agent (catalyst). Also ink-supply tubes made of this material exhibited outstanding qualities for use in relation with the described inkjet array.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An inkjet array comprising a piezoelectric member and a member in the form of a plate opposite said piezoelectric member, that surface of said plate which faces said piezoelectric member being provided with a number of parallel elongated ink ducts, said piezoelectric member being provided with a number of elongated parallel piezoelectric elements substantially rectangular in cross-section, each piezoelectric element being situated opposite an ink duct, and a baseplate provided with at least one reference member, said piezoelectric member being received in a recess in said baseplate and abutting the surface of said plate member containing said ink ducts, the piezoelectric member being fixed to said plate member, and the at least one reference member locating the piezoelectric elements in the baseplate and aligning the baseplate with the plate member.

2. The inkjet array according to claim 1, wherein said piezoelectric member is constructed from a support plate on which are secured a number of parallel piezoelectric elements, said support plate projecting from said piezoelectric elements at one end thereof, and being provided at its top with electrodes each connected to a respective piezoelectric element.

3. The inkjet array according to claim 2, wherein said piezoelectric elements disposed on said support plate are interconnected, while each of said electrodes on said support plate is connected to a current supply line.

4. The inkjet array according to claims 2 or 3, characterized in that said support plate is made from a ceramic material.

5. The inkjet array according to claim 1, wherein there are provided in gaps between said piezoelectric elements separating strips which fill said gaps and which are detached from said piezoelectric elements.

6. The inkjet array according to claim 2, wherein said piezoelectric elements and parts of said support plate situated on either side of said piezoelectric elements are covered by a plastic covering layer.

7. The inkjet array according to claim 6, wherein at one end of said covering layer there is provided a projecting part received in said baseplate recess, covering said piezoelectric member at one end.

8. The inkjet array according to claim 1, wherein said ink ducts have a constant depth over their entire length, have a constant rectangular cross-section over a major part of their length, and gradually decrease in cross-section near ends which merge into a jet.

9. The inkjet array according to claim 1, wherein said plate member includes at least one reference member and wherein said baseplate and said plate member are secured to one another by bolts screwed into locating bushings extending in the at least one reference member in said baseplate and the at least one reference member in said plate member.

10. The inkjet array according to claim 1, further including a heating element by means of which ink, solid at room temperature, can be made liquid in said ink ducts during operation.

11. A method of making an inkjet array, which comprises providing a piezoelectric member, providing a plate member situated opposite said piezoelectric member and having on its surface facing said piezoelectric member a number of parallel elongated ink ducts, said piezoelectric member being fixed in a baseplate provided with at least one reference member, fixing said baseplate to said plate member by using at least one reference member during the assembly of said inkjet array, forming parallel incisions in said piezoelectric member to form piezoelectric elements, and locating said incisions with said at least one reference member.

12. The method according to claim 11, wherein said piezoelectric member comprises a support layer consisting of ceramic material covered by a metal layer, and a piezoelectric layer disposed on said metal layer, cutting through said resulting piezoelectric member through said piezoelectric layer into said support layer.

13. The method according to claims 11 or 12, wherein facing boundary surfaces of said piezoelectric elements are treated, prior to introduction of an insulating material between said piezoelectric elements, with a material which counteracts any adhesion of said insulating material to said piezoelectric elements.

14. The method according to claim 11, wherein after said parallel incisions have been formed, a plastic covering layer is applied over said piezoelectric elements with the simultaneous filling of said incisions with said plastic.

15. A method of making a plate member associated with an inkjet array, the method comprising the steps of providing a plate member, providing a surface of said plate member with a reference member used in assembly of said plate member and a piezoelectric member in said inkjet array, and forming ink duct in the plate member while using said reference member for locating the ink ducts to be formed.

16. The method according to claim 15, further comprising the step of using a bolt-hole for the reference member, a bolt being receivable in the bolt-hole for fixing said piezoelectric member to the plate member provided with ink ducts.

17. The inkjet array according to claim 9, wherein the at least one reference member in the baseplate includes an opening and wherein at least one reference member in the plate member includes an opening, the at least one opening of the baseplate being aligned with the at least one opening of the plate member when the piezoelectric member is fixed to the plate member.

18. The method according to claim 11, wherein the at least one reference member is an opening in the baseplate and wherein the plate member has at least one reference member comprising an opening, the method further comprising the step of aligning the baseplate with the plate member during assembly of the inkjet array by using the at least one reference members of the baseplate and plate member.

19. An inkjet array comprising:

a piezoelectric member having a plurality of elongated, parallel piezoelectric elements, the plurality of piezoelectric elements having a substantially rectangular cross-section;

a plate member opposite the piezoelectric member, the plate member having a plurality of parallel elongated ink ducts, each of the piezoelectric elements being situated opposite an ink duct;

a baseplate, the piezoelectric member being received in a recess in the baseplate and abutting the surface of the plate member containing the ink ducts, the piezoelectric member being fixed to the plate member; and reference means for aligning the baseplate with the plate member, the reference means including at least one opening in both the baseplate and the plate member which openings are aligned when the baseplate and plate member are mounted together.

20. The inkjet array according to claim 19, wherein the reference means further locates the piezoelectric elements in the baseplate whereby the piezoelectric elements are aligned with the respective parallel elongated ink ducts when the baseplate is mounted to the plate member.

* * * * *